US011172580B2

(12) United States Patent
Gaertner, II

(10) Patent No.: US 11,172,580 B2
(45) Date of Patent: Nov. 9, 2021

(54) BGA COMPONENT MASKING DAM AND A METHOD OF MANUFACTURING WITH THE BGA COMPONENT MASKING DAM

(71) Applicant: Rosemount Aerospace Inc., Burnsville, MN (US)

(72) Inventor: James R. Gaertner, II, Hastings, MN (US)

(73) Assignee: Rosemount Aerospace Inc., Burnsville, MN (US)

( * ) Notice: Subject to any disclaimer, the term of this patent is extended or adjusted under 35 U.S.C. 154(b) by 317 days.

(21) Appl. No.: 15/657,985

(22) Filed: Jul. 24, 2017

(65) Prior Publication Data

US 2019/0029121 A1 Jan. 24, 2019

(51) Int. Cl.
*H05K 3/22* (2006.01)
*H05K 1/02* (2006.01)
*H05K 3/28* (2006.01)

(52) U.S. Cl.
CPC ............. *H05K 3/22* (2013.01); *H05K 1/0213* (2013.01); *H05K 3/284* (2013.01); *H05K 1/0271* (2013.01); *H05K 2201/068* (2013.01); *H05K 2201/09909* (2013.01); *H05K 2203/1316* (2013.01); *H05K 2203/1377* (2013.01)

(58) Field of Classification Search
CPC ............ H05K 3/284; H05K 3/28; H05K 3/22; H05K 3/30; H05K 1/0213; H05K 1/0271; H05K 2201/068; H05K 2201/09909; H05K 2203/1377; H05K 2203/1316; Y10T 29/49146; Y10T 29/4913; Y10T 29/49171

USPC ........... 29/832, 829, 833–841, 855; 174/252, 174/548; 361/702
See application file for complete search history.

(56) References Cited

U.S. PATENT DOCUMENTS

| | | | | |
|---|---|---|---|---|
| 3,634,930 A | * | 1/1972 | Cranston | H01L 24/81 438/15 |
| 5,517,753 A | * | 5/1996 | Messina | H01L 23/4006 257/E23.084 |
| 5,966,814 A | * | 10/1999 | Lin | A47G 21/02 30/123 |
| 6,292,369 B1 | * | 9/2001 | Daves | H01L 21/50 361/719 |
| 6,542,379 B1 | * | 4/2003 | Lauffer | H01F 17/0033 174/260 |
| 6,655,021 B2 | * | 12/2003 | Jansson | H05K 3/0061 29/593 |
| 6,847,527 B2 | * | 1/2005 | Sylvester | H01L 21/4857 174/255 |
| 7,596,863 B2 | * | 10/2009 | Bhatt | H05K 1/112 174/254 |
| 7,645,633 B2 | | 1/2010 | Barnes et al. | |
| 8,613,132 B2 | * | 12/2013 | Finn | G06K 19/07722 29/601 |

(Continued)

Primary Examiner — Peter Dungba Vo
Assistant Examiner — Kaying Kue
(74) Attorney, Agent, or Firm — Kinney & Lange, P. A.

(57) ABSTRACT

The proposed masking dam protects ball grid array integrated circuit components from conformal coating overflow, preventing joint breakage and thermal mismatch. The masking dam includes a frame with an integrated seal, a cover, and a fastening mechanism. The frame is sealed to a circuit board surround a component, the cover is attached to the frame, and the masking dam is secured to protect the component.

17 Claims, 3 Drawing Sheets

(56) References Cited

U.S. PATENT DOCUMENTS

| | | | |
|---|---|---|---|
| 8,978,247 B2* | 3/2015 | Yang | H01L 21/6835 |
| | | | 29/852 |
| 9,601,451 B2 | 3/2017 | Kuczynski et al. | |
| 2002/0001981 A1* | 1/2002 | Ong | H01L 21/4853 |
| | | | 439/71 |
| 2002/0050058 A1* | 5/2002 | Jansson | H05K 7/20509 |
| | | | 29/832 |
| 2009/0103267 A1* | 4/2009 | Wieland | H05K 7/20409 |
| | | | 361/707 |
| 2009/0175000 A1* | 7/2009 | Japp | H05K 3/4655 |
| | | | 361/679.55 |
| 2010/0052137 A1* | 3/2010 | Meyer | H01L 24/48 |
| | | | 257/687 |
| 2011/0310605 A1* | 12/2011 | Renn | F21V 19/0035 |
| | | | 362/235 |
| 2013/0058100 A1* | 3/2013 | Rose | F21V 29/58 |
| | | | 362/294 |
| 2014/0271123 A1* | 9/2014 | Rosinski | F04D 13/14 |
| | | | 415/60 |
| 2015/0181773 A1* | 6/2015 | Ueda | H05K 9/0028 |
| | | | 361/818 |
| 2016/0262272 A1* | 9/2016 | Oba | H05K 5/061 |
| 2016/0345440 A1 | 11/2016 | Kasagani et al. | |

* cited by examiner

BGA COMPONENT MASKING DAM AND A METHOD OF MANUFACTURING WITH THE BGA COMPONENT MASKING DAM

BACKGROUND

Conformal coatings are commonly formed on circuit boards to protect circuit board components. Typically, conformal coatings are a thin polymeric film that conforms to the contours of a printed circuit board. The conformal coating protects against moisture, dust, chemicals, and temperature extremes that would otherwise result in damage to or failure of components.

However, when conformal coatings are applied to components, the conformal coating has a tendency to run underneath components. The conformal coating comes into contact with lead solder joints under the components. Differing coefficients of thermal expansion cause problems with those solder joints if the conformal coating bridges between the component body and the circuit board. The mismatch of the coefficients of thermal expansion between electronic components and coating, compared to the solder results in solder joints breaking and cracking.

SUMMARY

A masking dam includes a removable cover configured to protect a component, and a frame. The frame includes a seal embedded in the frame, the seal configured to sealingly engage a circuit board, a mounting feature configured to attach the frame to the circuit board, and a securing feature configured to attach the frame to the removable cover.

A method of protecting a component on a circuit board includes sealing a frame to the circuit board surrounding the component with a seal located in the frame, placing a cover onto the frame above the component opposite the circuit board, and securing the cover to the circuit board with an attachment mechanism.

DETAILED DESCRIPTION

Components for circuit boards can be custom built and of a variety of sizes or shapes. The proposed masking dam can be custom made through traditional 3-D printing processes to protect unique components on circuit boards from solder joint breakage and other damage caused by thermal expansion with component mismatches in coefficients of thermal expansions (CTE).

Figure 1A:
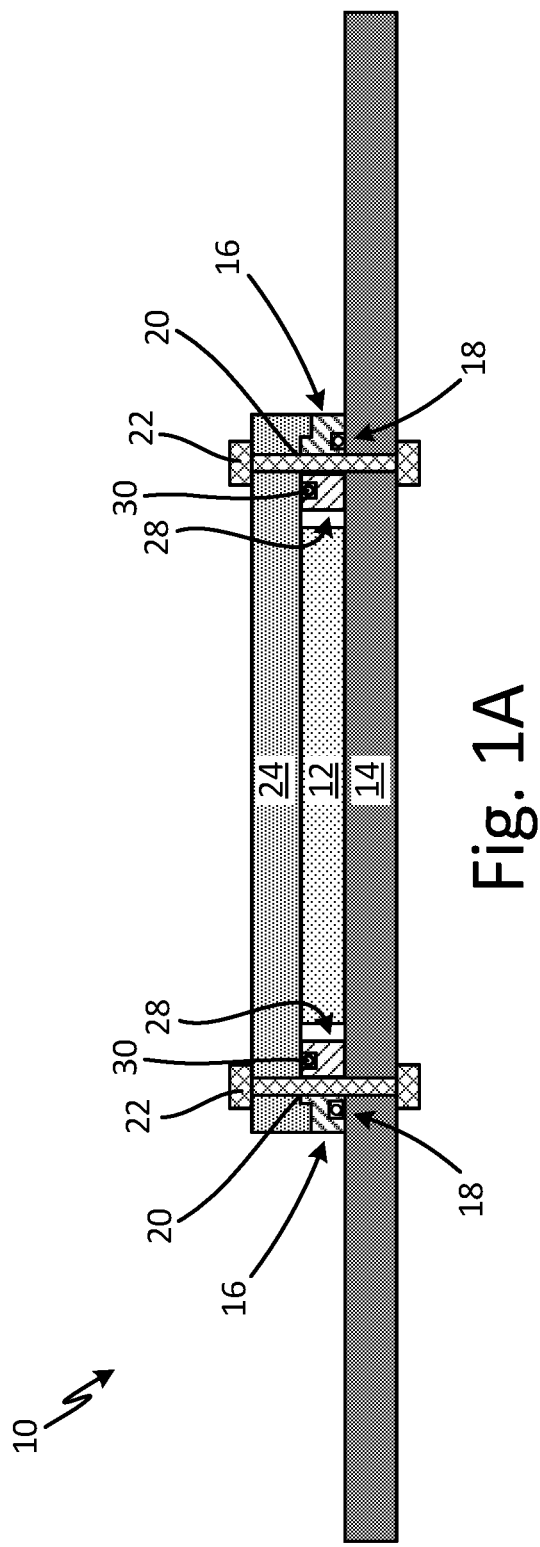
FIG. 1A-D are schematic views of a masking dam covering a component on a circuit board.
Figure 1C:
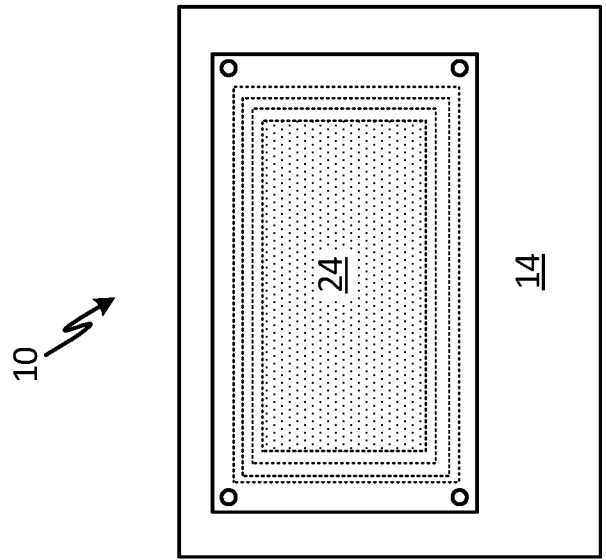
Figure 1B:
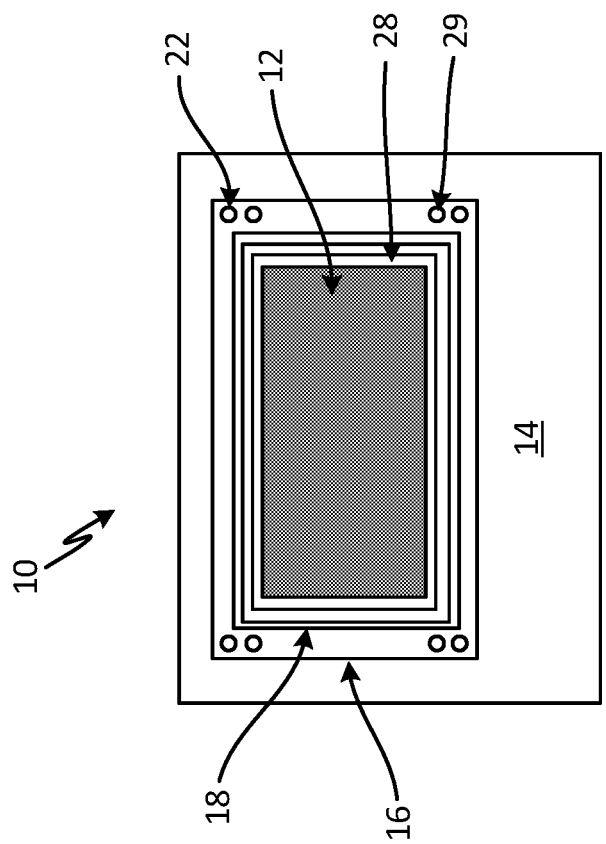

FIGS. 1A-D are schematic diagrams of masking dam 10 and circuit board 14. FIG. 1A is a schematic cross-sectional view of masking dam 10 covering component 12 on circuit board 14. FIG. 1B is a top-down view of masking dam 10 without a cover. FIG. 1C is a top-down view of masking dam 10 with a cover. FIGS. 1A-C will be discussed together. Masking dam 10 includes frame 16, seal 18, holes 20, fasteners 22, cover 24, and optional seal 30. Circuit board 14 includes component 12, which can for example be a ball grid array (BGA) integrated circuit (IC) component. Circuit board 14 is a circuit board with one or more components attached.

Masking dam 10 protects component 12 when circuit board 14, containing component 12, is being coated with a conformal coating. Masking dam 10 prevents a conformal coating from bridging between component 12's body and circuit board 14, which prevents coefficient of thermal expansion (CTE) mismatch between component 12 and circuit board 14 experienced by both the conformal coating and solder joints connecting component 12 to circuit board 14, thereby protecting the solder joints connecting component 12 to circuit board 14.

Frame 16 of masking dam 10 can be a rectangular frame created through standard 3-D printing processes so that frame 16 is small enough for particular circuit board applications. Typically, frame 16 is fitted to component 12 that it will surround. Frame 16 can be made of different materials depending on the construction of component 12. If masking dam 10 will be applied to circuit board 14 after reflow processing is complete, materials may include injection molded plastics, or other low melting point plastics commonly molded for electronics.

If masking dam 10 is applied to component 12 on circuit board 14 prior to reflow processing, then frame 16, seal 18, and cover 24 must be able to withstand high temperatures of the reflow processing. Thus, frame 16 should be able tolerate temperatures up to 260 degrees Celsius. Materials that can be used for frame 16 include, for example, aluminum, carbon fiber, ceramic, metal filament mixes, or other materials suitable for 3-D printing. Plastics, such as nylon 6-6, PBT polyester, polyphenylene sulfide, polyetherimide, liquid-crystal polymers, or other suitable polymers, can also be used.

Frame 16 can be made of a material with low electrical conductivity, and can for example, have impedance greater than 1 mega ohm to 10 mega ohms in most cases. This allows masking dam 10 to be placed on circuit board 14 without special constraints on circuit board 14. If masking dam 10 is made of highly electrically conductive material, circuit board 14 cannot have any conductive paths, pads or vias on a top layer below masking dam 10.

Frame 16 is a rectangular to encompass component 12. Frame 16 includes an integrated seal or a slot to accept a seal (discussed in reference to seal 16 below), should be coplanar with circuit board 14 when applied, has a stepped feature on its top to lock with cover 24, and can have holes 20 or other methods of fastening cover 24 to frame 16. Holes 20 can also align with other corresponding features on circuit board 14. Optionally, frame 16 can also contain seal 30 to sealingly engage cover 24 as discussed below.

Seal 18 is embedded within frame 16, or reside in a groove on frame 16. Seal 18 is constructed of a material that will have the ability to seal with a circuit board. Circuit board 14 can be made of, for example, FR4 fiberglass or similar. For example, seal 18 can be made of neoprene or silicon rubber or flurosilicon rubber. Specifically, Auburn Fr320, HT-870, HT-800, HT-840 and others can be used. Seal 18, like frame 16, should be able to withstand up to 260 degrees Celsius if masking dam 10 is installed on circuit board 14 prior to reflow processing. Seal 18 functions to seal frame 16 to circuit board 14 and prevent conformal coating from wicking under component 12.

Cover 24 is placed over frame 16 to cover component 12. Cover 24 can be made of the same material as frame 16, or alternatively made of a circuit board material such as FR4. As discussed earlier, if reflow processing will occur after application of masking dam 10, then cover 24 must be made of a material able to withstand at least the operating temperature of the reflow processing (e.g. 260 degrees Celsius). In FIG. 1, cover 24 can be held to frame 16 by fasteners 22 going through holes 20 in frame 16.

Optionally, second seal 30 can be added on top of frame 16 to seal cover 24 to frame 16. A second seal would be similar to seal 18 in FIG. 1A. Additionally, a lip feature can be made on cover 24 to lock cover 24 onto frame 16, or a feature to hold down cover 24 on masking dam 10 and circuit board 14 can be used. When cover 24 and frame 16 are secured over component 12, air gap 28 typically exists between component 12 and masking dam 10. Such a locking feature can be used in conjunction with a second seal, or in the alternative.

Figure 1D:
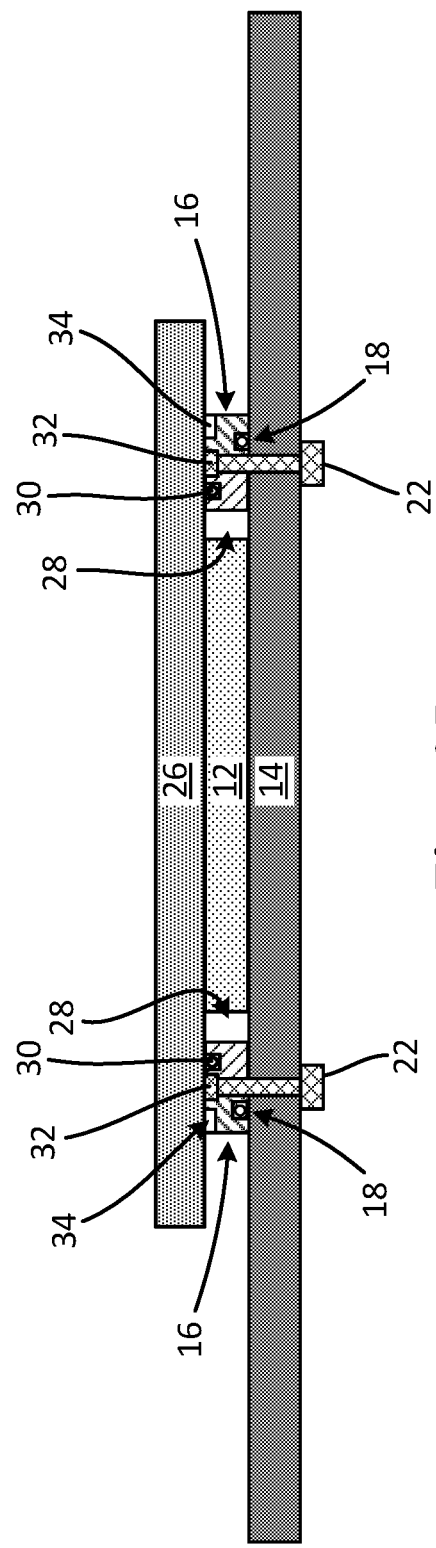

Holes 20 and fasteners 22 secure frame 16 and cover 24 in place over component 12 on circuit board 14. Holes 20 are in frame 16. In FIG. 1B, four holes are situated at each corner of frame 16 for four fasteners. Additionally, FIG. 1B shows a second set of holes 29 for fastening frame 16 to circuit board 14. In FIGS. 1A-1D, fasteners such as screws, bolts, or rivets are secured into holes 22, 29 to attached frame 16 and cover 24 to board 14. The fasteners may be level with the top plane of frame 16 or cover 24. In FIG. 1D, fasteners 32 are sunk into frame 16 to allow for heat sinking feature 26. Alternatively, other securing methods may be used to hold frame 16 and cover 24 in place on board 14.

FIG. 1D shows an embodiment of frame 16 on circuit board 14 with heat sink feature 26. The embodiment in FIG. 1D also includes gaps 34 between heat sinking feature 26 and frame 16, and sunk fastener heads 32 that are embedded between frame 16 and heat sinking feature 26. In this embodiment, frame 16 can has a height less than that of component 12 when mounted on circuit board 14. This allows heat sinking feature 26 on top of component 12. In this instance, cover 24 is discarded or reused on another assembly. Then, heat sinking feature 26 replaces cover 24 on component 12. Such a replacement would occur after circuit board 14 has been coated. If cover 24 is discarded in favor of heat sinking feature 26, then frame 16 allows a flat plate heatsink to extend beyond the dimensions of frame 16. Thus, heat sinking feature 26 is larger than frame 16 but still planar.

The disclosed masking dam can keep conformal coating from flowing underneath components throughout a circuit board manufacturing process. By providing a cover, the masking dam can keep conformal coating off the component, which allows the component to be heat sunk from a top surface furthest from circuit board 14 after the cover is removed. The seal under the frame of the masking dam can keep coating from flowing under the component when the masking dam is compressed. Furthermore, the masking dam can reside on the circuit board after circuit board assembly with no risk of damaging the component or the conformal coating, because removal of masking dam 12 would abrasively tear up part of a conformal coating, as well as potentially pull up a top layer of circuit traces. Alternatively, the masking dam can be placed after a reflow process is completed.

Discussion of Possible Embodiments

The following are non-exclusive descriptions of possible embodiments of the present invention.

A masking dam includes a removable cover configured to protect a component, and a frame. The frame includes a seal embedded in the frame, the seal configured to sealingly engage the removable cover and a circuit board, a mounting feature configured to attach the frame to the circuit board, and a securing feature configured to attach the frame to the removable cover.

The masking dam of the preceding paragraph can optionally include, additionally and/or alternatively, any one or more of the following features, configurations and/or additional components:

The securing feature comprises a second seal between the frame and the removable cover.

The securing feature comprises a lip feature configured to lock the removable cover onto the frame.

The removable cover comprises a feature configured to hold the removable cover down on the frame and the circuit board.

The removable cover is made of a material selected from the group consisting of aluminum, carbon fiber, ceramic, metal filament mixes, fiberglass, FR4, nylon 6-6, PBT polyester, polyphenylene sulfide, polyetherimide, liquid-crystal polymers and combinations thereof.

The frame is made of a material selected from the group consisting of aluminum, carbon fiber, ceramic, metal filament mixes, nylon 6-6, PBT polyester, polyphenylene sulfide, polyetherimide, liquid-crystal polymers and combinations thereof.

A height of the frame is less than a height of the component such that the component may be heat sunk with a top plane of the integrated circuit.

The frame comprises a slot where the seal resides.

The masking dam includes a second seal between the frame and the removable cover.

The masking dam has an impedance of at least 1 mega ohm to 10 mega ohms. The masking dam is configured to tolerate up to 260 degrees Celsius.

The mounting feature is one or more holes configured to receive fasteners.

A method of protecting a component on a circuit board includes sealing a frame to the circuit board surrounding the component with a seal located in the frame, placing a cover onto the frame above the component opposite the circuit board, and securing the cover to the circuit board with an attachment mechanism.

The method of the preceding paragraph can optionally include, additionally and/or alternatively, any one or more of the following features, configurations and/or additional components:

The method includes sealing the cover to the frame with a second seal.

The method includes locking the cover to the frame with a lip feature on the cover.

Sealing the frame to the circuit board comprises aligning the frame with the circuit board in a plane such that the frame and the circuit board are co-planar.

Sealing the frame to the circuit board is accomplished with a seal integrated into the frame.

Securing the cover to the circuit board is done with one or more fasteners.

The masking dam has an impedance of at least 1 mega ohm to 10 mega ohms.

The masking dam is configured to tolerate up to 260 degrees Celsius.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodi-

The invention claimed is:

1. A masking dam comprising:
   a removable cover configured to protect a component; and
   a frame comprising:
   an integrated seal embedded in the frame, the integrated seal configured to sealingly engage the removable cover and a circuit board, wherein the integrated seal resides in a groove on the frame;
   a mounting feature configured to attach the frame to the circuit board; and
   a securing feature configured to attach the frame to the removable cover;
   wherein, the frame and the integrated seal are configured to tolerate up to 260 degrees Celsius and the masking dam prevents a conformal coating from flowing underneath the component and bridging between the component and the circuit board when the conformal coating is applied during a circuit board manufacturing process, thereby preventing a coefficient of thermal expansion mismatch between the component and the circuit board and protecting solder joints connecting the component to the circuit board; and
   wherein, the removable cover is removed after the conformal coating is applied during the circuit board manufacturing process to permit a heat sink to be attached to a top surface of the component.

2. The masking dam of claim 1, wherein the securing feature comprises a second seal between the frame and the removable cover.

3. The masking dam of claim 1, wherein the securing feature comprises a lip feature configured to lock the removable cover onto the frame.

4. The masking dam of claim 1, wherein the removable cover comprises a feature configured to hold the removable cover down on the frame and the circuit board.

5. The masking dam of claim 1, wherein the removable cover is made of a material selected from a group consisting of aluminum, carbon fiber, ceramic, metal filament mixes, fiberglass, FR4, nylon 6-6, PBT polyester, polyphenylene sulfide, polyetherimide, liquid-crystal polymers, and combinations thereof.

6. The masking dam of claim 1, wherein the frame is made of a material selected from a group consisting of aluminum, carbon fiber, ceramic, metal filament mixes, nylon 6-6, PBT polyester, polyphenylene sulfide, polyetherimide, liquid-crystal polymers, and combinations thereof.

7. The masking dam of claim 1, wherein a height of the frame is less than a height of the component such that the component is heat sunk with a top plane of the component.

8. The masking dam of claim 1, wherein the frame comprises a slot of the groove where the integrated seal resides.

9. The masking dam of claim 1, further comprising a second seal between the frame and the removable cover.

10. The masking dam of claim 1, wherein the masking dam has impedances of at least 1 mega ohm to 10 mega ohms.

11. The masking dam of claim 1, wherein the mounting feature is one or more holes configured to receive fasteners.

12. A method of protecting a component on a circuit board comprising:
    sealing a frame to the circuit board surrounding the component with an integrated seal embedded in the frame, wherein the frame and the integrated seal are configured to tolerate up to 260 degrees Celsius and the integrated seal resides in a groove on the frame;
    placing a cover onto the frame above the component opposite the circuit board; and
    securing the cover to the circuit board with an attachment mechanism wherein the frame, the cover, and the integrated seal are components of a masking dam that prevent a conformal coating from flowing underneath the component and bridging between the component and the circuit board when the conformal coating is applied during a circuit board manufacturing process, thereby preventing a coefficient of thermal expansion mismatch between the component and the circuit board and protecting solder joints connecting the component to the circuit board;
    removing the cover after the conformal coating is applied during the circuit board manufacturing process; and
    attaching a heat sink to a top surface of the component.

13. The method of claim 12, further comprising sealing the cover to the frame with a second seal.

14. The method of claim 12, further comprising locking the cover to the frame with a lip feature on the cover.

15. The method of claim 12, wherein sealing the frame to the circuit board comprises aligning the frame with the circuit board in a plane such that the frame and the circuit board are co-planar.

16. The method of claim 12, wherein securing the cover to the circuit board is done with one or more fasteners.

17. The method of claim 12, wherein the masking dam has an impedance of at least 1 mega ohm to 10 mega ohms.

* * * * *